United States Patent [19]
Schlesinger

[11] 3,949,143
[45] Apr. 6, 1976

[54] EPOXY RESIN COATINGS CURED WITH PHOTOTROPIC AROMATIC NITRO COMPOUNDS

[75] Inventor: Sheldon I. Schlesinger, Hightstown, N.J.

[73] Assignee: American Can Company, Greenwich, Conn.

[22] Filed: Feb. 26, 1975

[21] Appl. No.: 553,261

Related U.S. Application Data

[62] Division of Ser. No. 331,179, Feb. 9, 1973, Pat. No. 3,895,952.

[52] U.S. Cl. .............. 428/413; 96/35.1; 96/115 P; 204/159.18; 204/159.23; 260/2 EP; 260/2 EC; 428/417; 428/418
[51] Int. Cl.$^2$ .......................................... G03C 1/68
[58] Field of Search .... 252/30; 204/159.18, 159.23, 204/159.13; 260/2 EP, 2 EC, 2 EA; 96/115 P, 115 R, 90 PC; 428/413

[56] References Cited
UNITED STATES PATENTS

| | | | |
|---|---|---|---|
| 3,450,613 | 6/1969 | Steinberg | 204/159.15 |
| 3,649,549 | 3/1972 | Margerum | 204/471 |
| 3,708,296 | 1/1973 | Schlesinger | 204/159.18 |
| 3,711,390 | 1/1973 | Feinberg | 96/115 P |
| 3,711,391 | 1/1973 | Feinberg | 96/115 P |
| 3,721,617 | 3/1973 | Watt | 204/159.14 |

OTHER PUBLICATIONS

Abron Bluhm et al., "Photoisomerization of o–Nitrobenzyl Compounds," Journ. of Organic Chemistry, Vol. 29, pp. 636–639, (1964).

*Primary Examiner*—George F. Lesmes
*Assistant Examiner*—R. J. Roche
*Attorney, Agent, or Firm*—Robert P. Auber; Ernestine C. Bartlett; George P. Ziehmer

[57] ABSTRACT

Photopolymerizable compositions comprising a polymerizable epoxide, vinyl ether, or other acid-catalyzed monomer and a phototropic, alkyl substituted-orthonitrobenzene containing compound are provided, which, when exposed to actinic radiation, are polymerized by the radiation produced acidic initiator.

8 Claims, No Drawings

EPOXY RESIN COATINGS CURED WITH PHOTOTROPIC AROMATIC NITRO COMPOUNDS

This is a division of application Ser. No. 331,179, filed Feb. 9, 1973, now U.S. Pat. No. 3,895,952.

BACKGROUND OF THE INVENTION

Phototropic (also known as photochromic and photothermochromic) compounds are generally known as compounds which isomerize or tautomerize reversibly to another form when exposed to actinic light of a suitable wave length. When this wavelength of irradiation is removed and either heat or light of a different wavelength of irradiation is applied, the reaction is reversed to give the original phototropic compound.

It has now been discovered that a specific class of phototropic compounds, when irradiated to an aci- or acidic form, are effective as photoinitiators for cationic polymerization of various monomers resulting in polymers thereof and such photo-induced reaction is eminently suitable for use in the graphic arts or as light-cured coatings.

Vinyl ethers and epoxy resins have been photopolymerized employing various catalysts and promoters therefor. For example, U.S. Pat. No. 3,708,296 issued Jan. 2, 1973 to S. I. Schlesinger and commonly assigned herewith, employs photosensitive catalyst precursors which are aryl diazonium salts of complex halogenides which release a Lewis acid upon irradiation to initiate polymerization of epoxide monomers and prepolymers.

Another procedure, U.S. Pat. No. 3,347,676 employs metal salts such as complex silver borates in combination with organic halogens.

None of the prior procedures are without their particular difficulties however. For example, epoxides and related compositions containing photosensitive catalyst precursors have a tendency to gel on standing, often necessitating the need for gelation inhibitors to prevent premature reaction, while silver compounds are becoming increasingly expensive, and are not practical alternatives for large scale commercial production. Accordingly, it is desirable to identify and discover new monomer catalyzing agents useful in the photopolymerization process which are not subject to and overcome the deficiencies now existing in the art.

SUMMARY OF THE INVENTION

This invention relates to new polymerizable compositions and to a process for effecting polymerization thereof. More specifically, this invention relates to compositions comprising at least one substance capable of cationic polymerization in admixture with organic compounds which are phototropic and are converted to an acid catalyst upon exposure to radiation and to a process for effecting the photopolymerization of such substances.

THE PHOTOTROPIC CATALYSTS

The catalysts employed herein possess the properties of isomerizing or tautomerizing to an acidic form when exposed to actinic radiation of a suitable wave-length. The compounds are converted to an acid form only when exposed to suitable irradiation and are stable in the presence of heat up to the decomposition temperature of the compound, in general, up to about 200°C. The catalysts herein are inert to most solvents and provide for a more varied use of the same where desired. The only requirement is that the solvent be relatively neutral, e.g., non-alkaline and non-acidic. This new class of photosensitive compounds possesses the properties also of increased speed and efficiency in catalyzing cationic polymerization and in yielding polymers which are receptive to ink, possess inherent superior toughness, abrasion resistance, adhesion to metal surfaces and resistance to chemical attack. The phototropic catalysts of the present invention may be defined as any aromatic compound possessing an alkyl, preferably methyl, substituted-nitrobenzene moiety wherein at least one nitro is in a position ortho to the alkyl substituent of the benzene ring, which itself may be part of a fused ring system. Other substituents on the benzene ring may be present, which are preferably electron-withdrawing groups which either (a) have a positive sigma ($\sigma$) substituent constant according to the Hammet equation, $\log K/Ko = \rho\sigma$, where $K$ is the equilibrium constant of the substituted compound, $Ko$ is the equilibrium constant of the unsubstituted compound, $\sigma$, the substituted constant, is the measure of the ability of the substituent to change the electron density at a reaction center and $\rho$ is a measure of the sensitivity of the equilibrium in question to a change in electron density. (See Hine, *Physical Organic Chemistry*, p. 69 to 75, (McGraw Hill) (New York), 1956) and/or (b) are known to have a meta-orienting effect in aromatic substitution reaction. Illustrative of such substituents are: $-NO_2$, $-CN$, $-COOR$, $-COR$, $-NR_3^+$,

$-Br$, $-Cl$, $-F$, $-I$; $RCOX$, $RX_3$, $-NO$, $RCO-$, $R_2NCO-$, wherein X is halogen, etc. For ease of discussion, such compounds will be referred to hereinafter as nitro-benzyl compounds although it is to be understood that such terminology is intended to indicate nitrotolyl or other radicals containing the nitro and alkyl substitutents on a benzene ring as hereinbefore discussed. An example of a phototropic compound is o-nitrotoluene which converts to the aci-form upon irradiation and reverse to the original form when irradiation is removed as indicated by the equation:

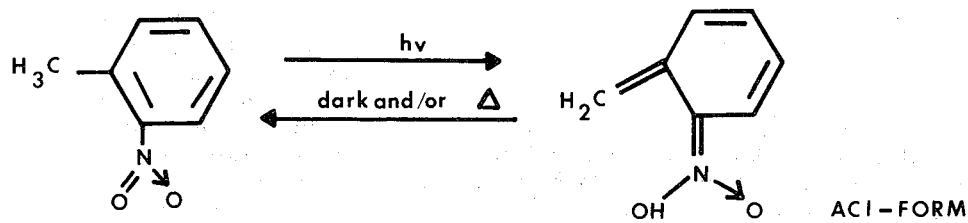

The phototropic compounds of the invention may include aromtic compounds designated by the general formula:

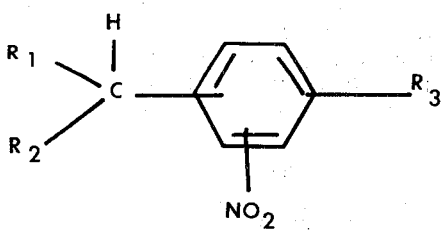

wherein $R_1$ and $R_2$ may be hydrogen, alkyl, aryl, carbalkoxy, pyridyl, carbazolyl. N-oxide-pyridyl, nitroalkyl, nitroaryl, alkaryl, aralkyl, haloalkyl and haloaryl radicals wherein the halogens are Br, Cl, F, and I; $R_3$ may be hydrogen, alkyl, aryl, either as a substituent or forming a fused ring system with the benzene ring, alkaryl, aralkyl, nitroalkyl, nitroaryl, haloalkyl, haloaryl, etc., or an electron - withdrawing group.

Especially preferred are those compounds wherein $R_1$ and $R_2$ are hydrogen, alkyl or aryl, for example, methyl or phenyl, and $R_3$ is hydrogen or a nitro group. Specific examples of phototropic compounds which may be used in the present invention include:
o-nitrotoluene
2,4-dinitrotoluene
2-(2'-nitro-4'-cyanobenzyl)pyridine
o-nitrobenzylpyridine
2-(2',4'-dinitrobenzyl)pyridine
4-(2',4'-dinitrobenzyl)pyridine
4-(2'-nitro-4'-cyanobenzyl)pyridine
2-(2',4'-dinitrobenzyl)pyridine
methyl bis(2,4-dinitrophenyl) acetate
4-(2',4'-dinitro benzyl) pyridine-N-oxide
ethyl bis (2,4-dinitrophenyl) acetate
2,4,4'-trinitrodiphenylmethyl acetate
ethyl 2,4,4'-trinitrodiphenyl acetate
2,4'-dinitrodiphenyl methane
2,3-dinitro-1-ethyl benzene
2,4,2',4'-tetranitrodiphenyl methane
tris(2,4-dinitrophenyl)methane
2,4,2'-trinitrodiphenyl methane
2-nitro-4-chlorotoluene
2,4,4'-trinitrodiphenyl methane
2-nitro-4-bromotoluene
2-nitro-4-cyanotoluene

THE POLYMERIZABLE SUBSTANCE

Substances that undergo cationic polymerization include compositions containing ethylenic unsaturation and compositions that polymerize by ring opening of cyclic groups.

Ethylenically unsaturated compounds capable of cationic polymerization, and therefore operable in the present invention, can be represented by the formula

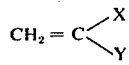

where X and Y are the same or different; X is hydrocarbyl, hydrocarbyloxy, halohydrocarbyloxy, hydroxyhydrocarbyloxy, hydrocarbonyloxyhydrocarbyloxy and Y is hydrogen or lower alkyl.

Examples of these types of ethylenically unsaturated compounds that can undergo cationic polymerization include methyl vinyl ketone, 1-butene, 1 dodecene, styrene, methyl styrene, vinyl methyl ether, vinyl 2-ethylhexyl ether, vinyl decyl ether, vinyl allyl ether, etc.

Because of availability and relative ease of polymerization, vinyl ethers constitute the preferred chemical class of ethylenically unsaturated compounds for use herein.

Cyclic compounds capable of cationic polymerization and therefore operable in the present invention include lactones and epoxides. An especially preferred class of cyclic reactants are monomeric and prepolymeric epoxides. Suitable epoxides include the classic epoxy resins obtained by the well known reaction of epichlorohydrin and bisphenol A (4,4'-isopropylidene diphenol) in either monomeric or prepolymeric forms.

Many other epoxide materials are available in polymerizable monomeric or prepolymeric forms. Among these are 1,2-epoxycyclohexane (cyclohexene oxide, also named 7-oxabicyclo-[4.1.0]heptane); and vinylcyclohexene dioxide, more specifically named 3-(epoxyethyl)-7-oxabicyclo[4.1.0]heptane or 1,2-epoxy-4-(epoxyethyl)cyclohexane. Ethylene oxide (oxirane,

the simplest epoxy ring) and its homologues generally, e.g., propylene oxide (1,2-epoxypropane) and 2,3-epoxybutane, are themselves useful; other useful cyclic ethers are the $C_3O$ ring compound trimethylene oxide (oxetane), derivatives thereof such as 3,3-bis-(chloromethyl)oxetane (also named 2,2-bis(chloromethyl)-1,3-epoxypropane), and the $C_4O$ ring compound tetrahydrofuran, as examples. Other epoxidized cycloalkenes may be used, a readily available polycyclic diepoxide being dicyclopentadiene dioxide, more specifically identified as 3,4-8,9-diepoxytricyclo-[5.2.1.0$^{2,6}$]decane. A suitable polyfunctional cyclic ether is 1,3,5-trioxane.

Glycidyl esters of acrylic acid and of its homologs, methacrylic acid and crotonic acid, are vinyl epoxy monomers of particular interest. Other such monomers are allyl glycidyl ether (1-allyloxy-2,3-epoxypropane) and glycidyl phenyl ether (1,2-epoxy-3-phenoxypropane). Other examples of suitable materials are copolymers of allyl glycidyl ether and glycidyl methacrylate as disclosed in co-pending application Ser. No. 297,829 filed Oct. 16, 1972. Another readily available product is a mixture of ethers of the structure

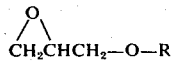

where R is alkyl, that is, glycidyl alkyl ethers. One such mixture contains predominantly glycidyl octyl ether and decyl glycidyl ether; another contains dodecyl glycidyl ether and glycidyl tetradecyl ether. Epoxidized novolak prepolymers likewise may be used, as well a polyolefin (e.g., polyethylene) epoxides. The latter are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxation then provides mixtures of the corresponding 1,2-epoxyalkanes, examples being mixtures high in the 1,2-epoxy derivatives of alkanes having 11 to 14 carbons, or having 15 to 18 carbons.

Esters of epoxidized cyclic alcohols, or of epoxidized cycloalkanecarboxylic acids, or of both, provide useful epoxide or polyepoxide materials. Thus a suitable ester of epoxidized cyclohexanemethanol and epoxidized cyclohexanecarboxylic acid is the diepoxide (3,4-epoxycyclohexyl)methyl 3,4-epoxycyclohexanecarboxylate; this same ester may be indexed under the name 7-oxabicyclo[4.1.0]hept-3-ylmethyl 7-oxabicyclo[4.1.0]heptane-3-carboxylate. Another suitable diepoxide may be obtained as an ester of a substituted (epoxycycloalkyl)methanol and a dibasic acid, for example, bis[3,4-epoxy-6-methylcyclohexyl)methyl]adipate, which may be named alternatively bis[(4-methyl-7-oxabicyclo[4.1.0]hept-3-yl)methyl]adipate. Diepoxide monomeric materials may be obtained conveniently as bis(epoxyalkyl) ethers of glycols, an example being the diglycidyl ether of 1,4-butanediol, that is, 1,4-bis-(2,3-epoxypropoxy)butane. This diepoxide is related to the diglycidyl ether of bisphenol A, discussed above as 2,2-bis]p-(2,3-epoxypropoxy)phenyl]propane.

Lactones tend to be readily polymerizable under the action of a cationic catalyst. Thus beta-propiolactone and epsilon-hexanolactone (epsiloncaprolactone) as well as other lactones as discloseed in copending U.S. application Ser. No. 292,759 filed Sept. 27, 1972, may be used in the process and compositions of the present invention.

The materials utilized as latent polymerization initiators in the process and compositions of the present invention are phototropic catalyst precursors which are converted to an acidic, catalytic form upon exposure to electromagnetic radiation. Thus, the catalyst precursors are photosensitive, and the required radiation is preferably imparted by actinic irradiation, which is most effective at those regions of the electromagnetic spectrum at which there is high absorption of electromagnetic energy by the particular catalyst precursor used. The catalyst precursors of the invention are converted to the acidic form necessary to initiate polymerization only where exposed to light. Heat enhances polymerization only when the catalyst is or has been exposed to irradiation but cannot in itself cause formation of acid catalyst. This property of the catalyst additionally serves to enhance the stability of a coating composition containing the catalyst before exposure and adds to improved storage and shelf stability. This property also permits the use of heat in a post-exposure amplification step which serves to enhance the intensity of the image formed. It should be understood the heat described is, of course, heat supplied which is below the thermal decomposition temperature of the catalyst.

The phototropic catalysts of the invention may be prepared using procedures known in the art, and such preparation forms no part of the present invention. Thus, for example methyl 2,4-dinitrophenyl acetate may be prepared by esterification of the corresponding acid, while 2,4,4'-trinitrodiphenyl methane may be prepared by decarboxylation of the corresponding acid in accordance with the method set forth by Bluhm et al. in Journal of Organic Chemistry, Vol. 29, 636–9, (1964). Many of the catalysts are readily available commercially.

A general application of the process of the invention can be as follows: the phototropic compound as hereinbefore defined is admixed in a suitable medium with the cationically polymerizable substance and, in a preferred embodiment of the invention, the mixture is coated on a suitable substrate such as a metal plate, plastic, paper, rubber, wood, wire screen, ceramic, glass, etc. After drying, the plate is exposed to ultraviolet radiation through a transparency with or without a post-exposure heating step. The resulting polymer is resistive to most solvents in the exposed areas. The unexposed areas can be washed with suitable solvents to leave an image of the polymer.

The source of radiation for carrying out the method of the present invention can be any suitable source, such as the ultraviolet actinic radiation produced by a mercury, xenon, or carbon arc, or the electron beam produced in a suitably evacuated cathode ray gun. The only limitation placed on the radiation source used is that it must have an energy level at the irradiated film sufficient to impart to the polymerizable system energy at an intensity high enough to convert the phototropic compound to the aci-form. The wavelength (frequency) range of the actinic radiation is chosen according to the particular phototropic compound and will generally be within the range of 2000 A to 7500 A and includes wavelengths within the visible and ultraviolet range of the spectrum.

The polymers produced by the polymerizing process of the present invention are useful in a wide variety of applications in the field of graphic arts, due to their superior adhesion to metal surfaces, excellent resistance to most solvents and chemicals, and capability of forming high resolution images. Among such uses are photoresists for chemical milling, gravure images, offset plates, stencil-making, microimages for printed circuitry, thermoset vesicular images, microimages for information storage, decoration of paper, glass, and packages, and light-cured coatings.

The procedures for mixing the polymerizable compositions of the present invention using epoxide materials, for example, are relatively simple. The monomer or prepolymer resin, or polymerizable mixture thereof, is combined with the phototropic catalyst, if desired with a suitable inert volatile solvent. By such a suitable solvent is meant any solvent compound or mixture which boils below about 190°C and which does not react appreciably with the monomer or the catalyst precursor. As discussed hereinabove, the present catalysts are inert to most solvents allowing for use of a wide range of compounds for this purpose including alcohols, esters, ketones, hydrocarbons, etc., the only requirement being that the solvent be non-alkaline and non-acidic. Examples of such solvents include acetonitrile, butyronitrile, acetone, toluene, methyl ethyl ketone, ethyl ether, anisole, dimethyl ether of diethylene glycol (bis(2-methoxyethyl) ether), monoclorobenzene, 1,1,2,2-tetrachloroethane, o-chlorotoluene, o-dichlorobenzene, and trichloroethylene or mixtures thereof.

The amount of phototropic catalyst precursor employed should be sufficient to insure complete polymerization. It has been found that quite satisfactory results are obtained by providing a nitrobenzyl compound in amount by weight from about 1 to about 70% of the catalyst precursor relative to the weight of the polymerizable material provided, about 5 to 30% being preferred with 5% or less being amply effective with some monomer catalyst precursor systems.

It may be desirable to include in the composition an inert pigment or filler, which may be present in even a major proportion by weight. Inclusion of such inert ingredients usually makes advisable a proportionate increase in the optimum amount of catalyst used. Nevertheless, the precursor needed rarely exceeds 30% of the entire weight of the composition in such cases.

The following examples will serve further to illustrate the present invention in which parts are by weight and temperature in degrees centigrade unless otherwise specified.

EXAMPLE 1

A mixture was prepared containing 1 g. of glycidyl methacrylate-allyl glycidyl ether copolymer, 0.3 g. of ethyl-bis-(2,4-dinitrophenyl) acetate, 1 ml. acetonitrile and ½ ml. acetone. Additional acetone was added until all of the catalyst dissolved forming a blue solution. The mixture was coated onto aluminum plate. An image of a key was made by exposing a coated plate sample with a key on the surface to a Gates Uviarc lamp for 6 minutes and then heated at 135°C for 30 minutes after which the exposed had changed from blue to yellow. The unexposed area was removed by washing with acetone leaving a negative image of the key in the form of a yellow polymer film in the exposed areas. A portion of this plate was dipped in dilute hydrochloric acid to determine the acid resistance of the coating. The coating was uneffected by the acid treatment.

A second coated plate sample was exposed on a portion of its surface for 15 minutes and heated for 15 minutes at 175°C. Washing with acetone then removed the exposed areas, leaving a yellow polymer film on the exposed areas.

EXAMPLE 2

30 grams of a 9% solution of glycidyl methacrylateallylglycidyl ether copolymer in a 6:1 butyronitrile-o-chlorotoluene solvent, was combined with 1.810 grams of 2,4-dinitrotoluene, whereupon a solution resulted which was spin-coated onto aluminum plate samples at 200 rpm spin speed. A portion of the surface of a coated sample was exposed to a 360 watt mercury arc at 20 cm distance for 2 minutes. The remainder of the surface was covered to exclude light. Following the exposure, the sample was immersed in a developing solvent composed of three volumes of trichloroethylene to one volume of acetone. Only the unexposed coating washed off the aluminum plate. Another sample, which was similarly exposed for 3 minutes and developed the same way, had good resistance to methylethyl ketone, as well. However, a superior film in terms of gloss, thickness and smoothness was formed when another sample was exposed for 5 minutes.

EXAMPLE 3

1.810 grams of ethyl bis-(2,4-dinitrophenyl)acetate was dissolved in 30 grams of the glycidyl methacrylate-allylglycidyl ether copolymer of Example 1. Coatings were made on aluminum plate samples at 200 rpm spin speed. A coated sample was exposed on part of its surface to the 360 watt mercury arc lamp for 5 minutes, and developed employing the developing solvent of Example 2. A good film remained only in the exposed areas. Those areas which were not exposed completely lost their coating. The light-cured coating had good resistance to methylethyl ketone.

EXAMPLE 4

A solution of 0.135 grams of tris(2,4-dinitrophenyl)-methane in 30 grams of the glycidyl methacrylate-allylglycidyl ether copolymer solution of Example 1 was prepared, and used to make spin coatings on aluminum plate. When a coated sample was exposed on part of its surface to a 360 watt mercury arc lamp at 20 cm distance for 5 seconds and developed as in Example 2, the coating was left as a faint film only in the exposed areas. A better film resulted after 30 seconds of exposure, with the best film resulting after at least 1 minute of exposure. Although 5 seconds of exposure under these conditons failed to give a sufficiently cured film to remain on during development, another sample, which was exposed for 5 seconds and immediately heated for 5 minutes at 130°C, left a satisfactory film in exposed areas of development.

EXAMPLE 5

A solution of 0.891 grams of ethyl bis-(2,4-dinitrophenyl)-acetate in 30 grams of the glycidyl methacrylate-allylglycidyl ether copolymer solution of Example 1 was used to make thin coatings on aluminum plate at 200 rpm. A sample of this coated plate was exposed for 5 minutes, and developed as in Example 3. A good film of the polymer was left only in the exposed areas. The unexposed areas were completely washed off. When another coated sample was exposed in the same way for 1 minute, followed by heating for 5 minutes at 130°C, development left a film in the exposed areas only.

The heating steps used in Examples 4 and 5 illustrate the enhancement of curing of the exposed film when heated following exposure. Only the exposed portions of the film were cured during this heating step.

EXAMPLE 6

A coating formulation was prepared consisting of 0.180 grams of tris(2,4-dinitrophenyl)methane in 30 grams of 12% ECN 1299 in butyronitrile. ECN 1299 is a trade name for CIBA's epoxy cresol novolak resin with molecular weight 1270 and epoxy equivalent 235. Spin coatings were made on aluminum plate samples at 200 rpm. A coated plate sample was exposed on part of its surface to a 360 watt mercury arc at 22 cm distance for 1½ minutes. Development of this plate in trichloroethylene resulted in a good film being left in exposed areas only, but not in unexposed areas. A better film in terms of gloss, thickness and smoothness was left in exposed areas when another sample was exposed for 2½ minutes and developed as with the first.

EXAMPLE 7

A solution of 0.810 grams of 2-(2',4'-dinitrobenzyl)-pyridine in 30 grams of the glycidyl methacrylate-allylglycidyl ether copolymer solution mentioned in Example 1 was used to make coatings on aluminum plate at 200 rpm. A coated sample was exposed on part of its surface for 2 minutes to a 360 watt mercury arc at 18 cm distance and developed as in Example 2. A coating image was left only in the exposed areas. The unexposed areas were washed clean of coating leaving a sharp demarcation between the exposed and the unexposed areas. Another sample when exposed for 60 seconds and developed as with the first sample, gave only a faint suggestion of a coating image in the exposed areas. However, when such a sample was heated for 2 minutes at 130° following the 60-second exposure, the coating image was enchanced leaving a clear, hard film in the exposed areas only with a sharp demarcation between the exposed and the unexposed areas.

It is thought that the invention and many of its attendant advantages will be understood from the foregoing description and it will be apparent that various changes may be made in the matter of ingredients, their identity, and their proportions and in the steps of the process and their order of accomplishment without departing from the spirit and scope of the invention or sacrificing all of its material advantages, the form hereinbefore described being merely a preferred embodiment thereof.

I claim:
1. A thermoset epoxy resin produced by exposing
   a monomeric or prepolymeric epoxide material, polymerizable to higher molecular weights by cationic polymerization, selected from the group consisting of glycidyl ethers of bisphenol A, epoxy-cycloalkanes, epoxy-cycloalkenes, epoxy-alkanes, glycidyl alkyl ethers, epoxy-novolacs and allyl glycidyl ether-glycidyl methacrylate copolymer containing as a photoactivatable initiator a phototropic aromatic compound containing at least one nitro radical in a position ortho to an alkyl substituent selected from compounds having the formula:

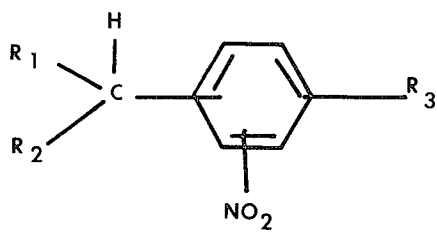

wherein $R_1$ and $R_2$ are selected from the group consisting of hydrogen, alkyl, aryl, carbalkoxy, pyridyl, carbazolyl, N-oxidopyridyl, nitroalkyl, nitroaryl, dinitrophenyl, alkaryl, aralkyl, haloalkyl and haloaryl radicals and $R_3$ is selected from the group consisting of hydrogen, alkyl, aryl, nitroalkyl, nitroaryl, alkaryl, aralkyl, haloalkyl, haloaryl radicals and electron-withdrawing groups selected from $-NO_2$, $-CN$, $-COOR$, $-COR$, $-NR_3$, $-Br$, $-Cl$, $-F$, $-I$, $-RCOX$, $-RX_3$, $-NO$, $RCO-$ and $R_2NCO-$ wherein X is halogen and R is alkyl;
   to sufficient electromagetic or electron beam radiaton to activate said phototropic compound to an acid form effective to initiate polymerization of said epoxide material.

2. The thermoset epoxy resin of claim 1 wherein the epoxide material is allyl glycidyl ether-glycidyl methacrylate copolymer.

3. The thermoset epoxy resin of claim 1 wherein the epoxide material is an epoxy cresol novolac.

4. As an article of manufacture, a composite sheet comprising a support and in surface contact therewith an adherent, organic solvent-insoluble layer over at least a portion of the surface of said support, said layer being comprised of the thermoset epoxy resin of claim 1.

5. The article of manufacture of claim 4 wherein said epoxide material is allyl glycidyl ether-glycidyl methacrylate copolymer.

6. The article of manufacture of claim 5 wherein said phototropic compound is ethyl bis(2,4-dinitrophenyl) acetate, 2,4-dinitrotoluene, tris(2,4-dinitrophenyl) methane or 2-(2',4'-dinitrobenzyl)-pyridine.

7. The article of manufacture of claim 4 wherein said epoxide is an epoxy cresol novolac.

8. The article of manufacture of claim 7 wherein said phototropic compound is ethyl bis(2,4-dinitrophenyl) acetate, 2,4-dinitrotoluene, tris(2,4-dinitrophenyl) methane or 2-(2',4'-dinitrobenzyl)-pyridine.

* * * * *